(12) United States Patent
Mizutani et al.

(10) Patent No.: US 6,872,248 B2
(45) Date of Patent: Mar. 29, 2005

(54) LIQUID-PHASE GROWTH PROCESS AND LIQUID-PHASE GROWTH APPARATUS

(75) Inventors: Masaki Mizutani, Nara (JP); Katsumi Nakagawa, Kyoto (JP); Tetsuro Saito, Kanagawa (JP); Tatsumi Shoji, Kanagawa (JP); Takehito Yoshino, Nara (JP); Shoji Nishida, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 80 days.

(21) Appl. No.: 10/400,636

(22) Filed: Mar. 28, 2003

(65) Prior Publication Data

US 2003/0230231 A1 Dec. 18, 2003

(30) Foreign Application Priority Data

Mar. 29, 2002 (JP) .......................... 2002-095996

(51) Int. Cl.[7] .......................... C30B 19/04; C30B 19/10
(52) U.S. Cl. .......................... 117/54; 117/200; 117/206
(58) Field of Search .......................... 117/54, 200, 206

(56) References Cited

U.S. PATENT DOCUMENTS 6,429,035 B2 * 8/2002 Nakagawa et al. ........... 438/57

FOREIGN PATENT DOCUMENTS

JP    5-330983    12/1993

OTHER PUBLICATIONS

K.J. Weber et al., "Prevention of Oxide Formation During Liquid Phase Epitaxy of Silicon," 66(10) Appl. Phys. Lett. 1243–1245 (1995).

* cited by examiner

Primary Examiner—Felisa Hiteshew
(74) Attorney, Agent, or Firm—Fitzpatrick, Cella, Harper & Scinto

(57) ABSTRACT

A liquid-phase growth process comprising immersing a base substrate in a solution containing reactant species to be grown dissolved therein which is accommodated in a crucible and growing a crystal film on said substrate, characterized in that a capping member is kept afloat on the surface of said solution before said substrate is immersed in said solution and said capping member is subsided in said solution upon immersing said substrate in said solution. A liquid-phase growth apparatus suitable for practicing said liquid-phase growth process.

12 Claims, 3 Drawing Sheets

F I G. 3
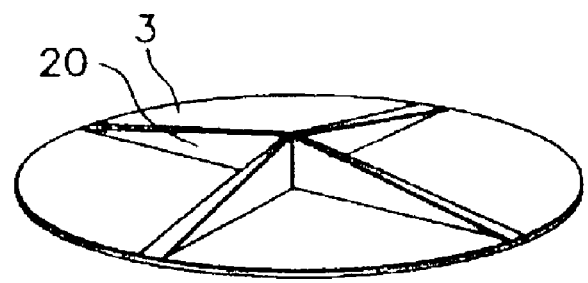
F I G. 4
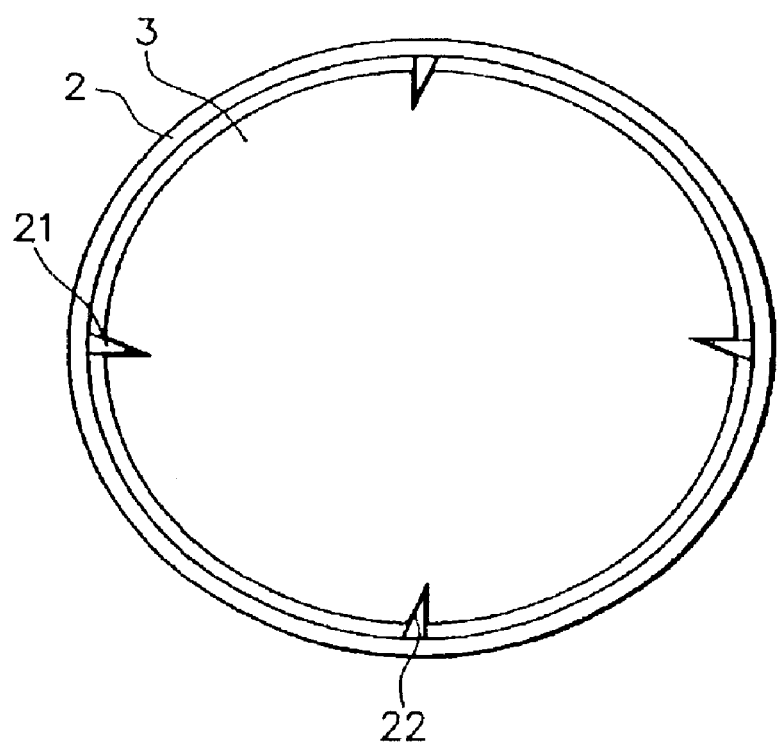

LIQUID-PHASE GROWTH PROCESS AND LIQUID-PHASE GROWTH APPARATUS

BACKGROUND OF THE INVENTION

1. Field of the Invention

The present invention relates to a liquid-phase growth process of immersing a base substrate in a heated solution containing reactant species to be grown dissolved therein and gradually cooling said solution to epitaxially grow said reactant species on said substrate and an apparatus suitable for practicing said liquid-phase growth process.

2. Related Background Art

It is known that when the solvent of a solution used for liquid-phase epitaxy is vaporized to deposit on a substrate before said substrate is immersed in said solution, an adverse effect is affected on liquid-phase epitaxial growth on said substrate.

Japanese Laid-open Patent Publication No. 5(1993)-330983 (Kumatoriya et al.) describes such adverse effect and a method for preventing said adverse effect from being brought about. Particularly, Kumatoriya et al. describes that in the case where a magnetic garnet single crystal film is grown on a base substrate by way of liquid-phase epitaxial growth from a solution comprising a solvent comprising PbO and $B_2O_3$ in which garnet constituent elements are dissolved, by making said solution to be in a supercooled state and immersing said substrate in said solution, there will be occurred a problem in that before the substrate is immersed in the solution, the substrate is directly exposed to vapor of PbO and the like vaporized from the solution where precipitates chiefly of PbO and the like are deposited on the substrate and this exerts an adverse effect which make it difficult to grow a high quality single crystal film on the substrate. Kumatoriya et al. describes a method for preventing this problem from being occurred in that a pair of baffle plates for preventing vapor of PbO and droplet of PbO from being deposited on the substrate are provided at a position above the substrate and at a position below the substrate.

However, the method of Kumatoriya et al. is still problematic in that because the baffle plates are retained on a substrate holder together with the substrate, it is difficult to prevent the solvent vapor from going around to reach the substrate. In addition to this, there is also a problem such that when the substrate is kept in a stand-by condition without being situated in the growth chamber, the solvent is vaporized to deposit on the inner wall face of the growth chamber so as to become a source which absorbs water and the like, where such source is liable to affect an adverse effect to the growth of the crystal film on the substrate. In addition, the method of Kumatoriya et al. has a disadvantage such that as the solvent is vaporized, a new solvent is necessitated to be suitably supplemented and this invites an increase in the production cost and a decrease in the productivity of a product.

Besides, in the case where an element whose melting point is low such as Ga is used as a solvent or a solute when a semiconductor crystal film is grown in accordance with the method of Kumatoriya et al., when the substrate is kept in a stand-by condition without being situated in the growth chamber, such element whose melting point is low is rapidly vaporized, where it is difficult to make the semiconductor crystal film to be grown on the substrate such that the composition of the semiconductor crystal film is uniform in every batch or the semiconductor crystal film is uniformly doped in every batch.

Separately, Weber et al., *Appl. Phys. Lett.* 66(10), pp. 1243–1245 (1995) describes that in the case where a silicon single crystal film is epitaxially grown on a base substrate from an indium solution, there is a problem such that prior to the step of immersing said substrate in said indium solution, said indium solution is liable to vaporize to deposit indium on the surface of the substrate, where said indium deposited on the substrate acts as a catalyst in such a way that oxygen and silicon in the atmosphere are reacted with each other to form a silicon oxide film on the substrate.

Similarly, there is known a technique in that in the case where a silicon single crystal film is epitaxially grown on a base substrate from an indium solution, a silicon substrate obtained by forming a porous layer on a surface of a silicon wafer and subjecting said silicon wafer to a hydrogen annealing treatment to flatten the surface thereof is used as said substrate. However, there is a problem in this case such that when prior to the step of immersing said substrate in said indium solution, said indium solution may evaporate to deposit indium on the surface of the substrate, where the flattened layer of the porous surface of the substrate is resorped due to the deposited indium such that the porous layer is exposed to bring about a growth defect in the structure of said silicon single crystal film grown on the substrate.

SUMMARY OF THE INVENTION

The present invention has been accomplished as a result of extensive studies by the present inventors in order to solve the foregoing problems in the prior art.

An object of the present invention is to provide a liquid-phase growth process which enables to efficiently form a high quality epitaxial film while restraining vaporization of the solvent, at a reasonable cost.

Another object of the present invention is to provide a liquid-phase growth apparatus suitable for practicing said liquid-phase growth process.

A typical embodiment of the liquid-phase growth process of the present invention comprising immersing a base substrate in a solution containing reactant species to be grown (hereinafter simply referred to as "reactant species") dissolved therein which is accommodated in a crucible and growing a crystal film on said substrate, characterized in that a capping member is kept afloat on the surface of said solution before said substrate is immersed in said solution and said capping member is subsided in said solution upon immersing said substrate in said solution.

In the liquid-phase growth process of the present invention, it is preferred that the substrate is retained by a substrate holder and that the capping member is subsided in the solution by intermeshing it to said substrate holder which retains the substrate.

It is preferred that the substrate holder which retains the substrate is rotated and together with the rotation of the substrate holder, the capping member intermeshed thereto is rotated.

In the liquid-phase growth process of the present invention, it is preferred that a guide member is provided at the inner wall of the crucible having the solution therein and the capping member is ascended or descended along the guide member.

In the liquid-phase growth process of the present invention, it is preferred that when the capping member is subsided in the solution, a pressure subjected thereunder is relieved by a pressure-removing means. In addition, it is preferred that when the capping member is subsided in the solution, the capping member is rotated to agitate the solution.

A typical embodiment of the liquid-phase growth apparatus of the present invention has a crucible for accommodating a solution containing reactant species dissolved therein and a substrate holder for retaining a base substrate and which serves to immerse said substrate in said solution accommodated in said crucible, wherein said substrate is immersed in said solution and a crystal film is grown on said substrate, characterized in that said liquid-phase growth apparatus has a capping member which is kept afloat on the surface of said solution accommodated in said crucible when said substrate is not immersed in said solution and said capping member is subsided in said solution when said substrate is immersed in said solution.

In the liquid-phase growth apparatus of the present invention, it is preferred that the substrate holder is provided with a meshing portion at the underside thereof and the capping member is provided with a protrusion at the surface side thereof which can be engaged in mesh with said meshing portion of the substrate holder. It is preferred that the capping member is subsided in the solution by intermeshing the capping member to the substrate holder in this way.

It is preferred that the substrate holder which retains the substrate is made to be rotatable so that together with the rotation of the substrate holder, the capping member intermeshed thereto can be rotated.

In the liquid-phase growth apparatus of the present invention, it is preferred that a guide member is provided at the inner wall of the crucible, which assists the capping member to ascend or descend.

In the liquid-phase growth apparatus of the present invention, it is preferred that the capping member is provided with a pressure-removing member for relieving a pressure subjected under the capping member when the capping member is subsided in the solution. In addition, it is preferred that the capping member is provided with a rotation means for rotating the capping means when the capping means is subsided in the solution.

BRIEF DESCRIPTION OF THE DRAWINGS

FIG. 3 is a schematic slant view illustrating an example of a capping member used in a liquid-phase growth apparatus in the present invention.

FIG. 4 is a schematic plan view illustrating an example of a crucible provided with a guide member at the inner wall thereof, which is used in a liquid-phase growth apparatus in the present invention.

DETAILED DESCRIPTION OF PREFERRED EMBODIMENTS

In the following, preferred embodiments of the present invention will be detailed with reference to the drawings. It should be understood that the present invention is not restricted by these embodiments.

Figure 1:
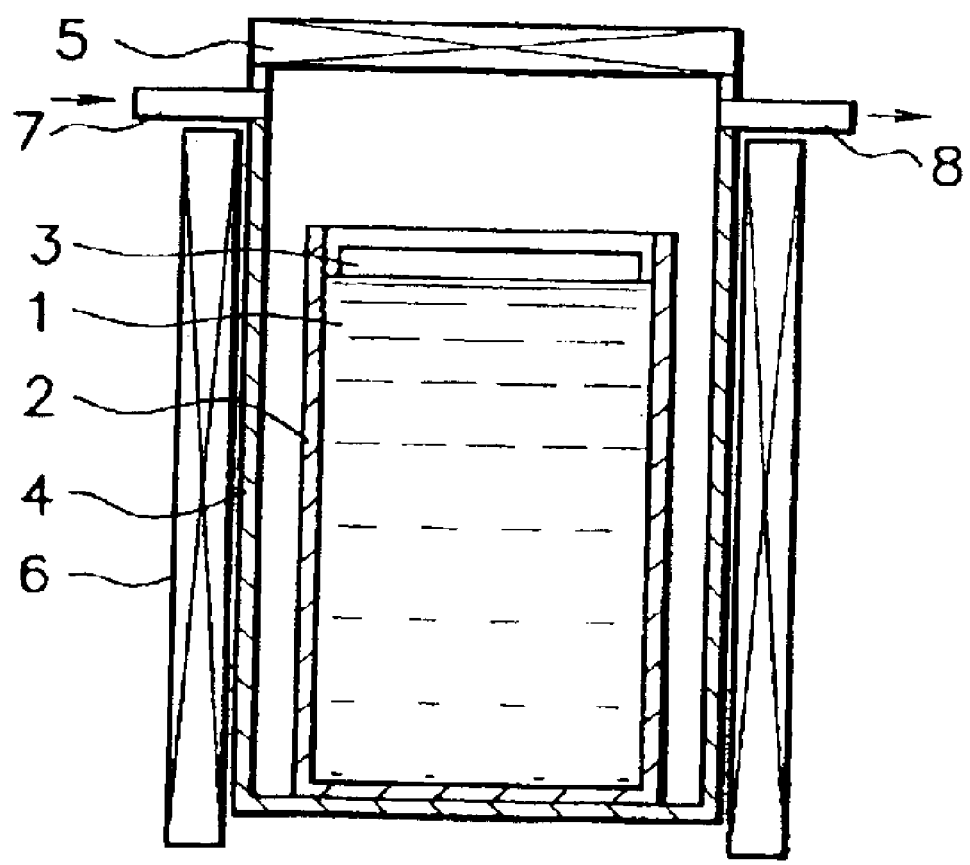
FIG. 1 is a schematic cross-sectional view illustrating an example of a liquid-phase growth apparatus in the present invention, which is in a stand-by condition where no substrate is immersed in a solution for liquid-phase epitaxy.
Figure 2:
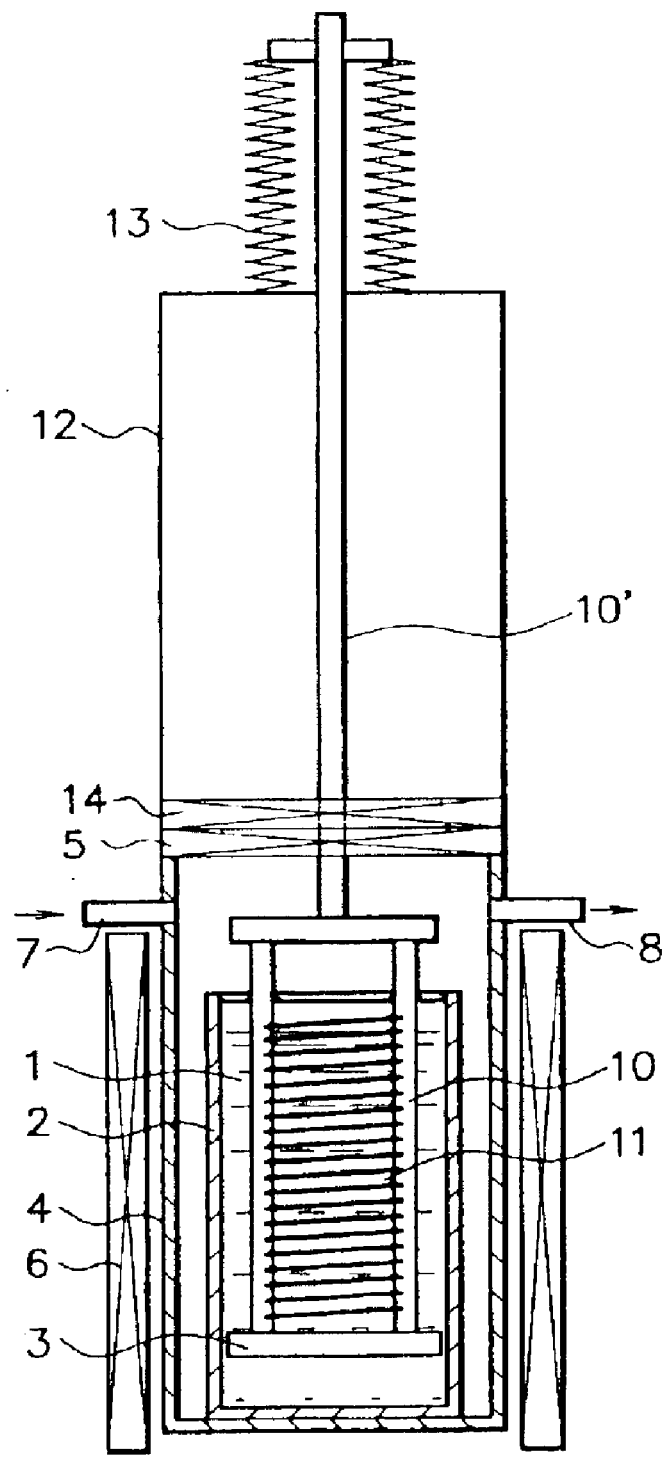
FIG. 2 is a schematic cross-sectional view illustrating an example of a liquid-phase growth apparatus in the present invention, which is in operation where a base substrate is immersed in a solution for liquid-phase epitaxy to grow an epitaxial film on said substrate.

FIG. 1 is a schematic cross-sectional view illustrating an example of a liquid-phase growth apparatus in the present invention, which is in a stand-by condition where no substrate is immersed in a solution for liquid-phase epitaxy. FIG. 2 is a schematic cross-sectional view illustrating an example of a liquid-phase growth apparatus in the present invention, which is in operation where a base substrate is immersed in a solution for liquid-phase epitaxy to grow an epitaxial film on said substrate.

First, description will be made with reference to FIG. 1. FIG. 1 shows an embodiment of the liquid-phase growth apparatus in the present invention which is in a stand-by condition where no substrate is immersed in a solution for liquid-phase epitaxy.

In FIG. 1, reference numeral 4 indicates a growth chamber structured to have an inside space capable of being hermetically sealed. In the inside space of the growth chamber 4, a bottomed cylindrical crucible 2 is arranged. In the crucible 2, a solution 1 containing reactant species dissolved therein is accommodated. The growth chamber 4 has an opening provided with a gate valve 5 capable of being closed or opened. Reference numeral 6 indicates a heater which is arranged so as to surround the circumferential wall of the growth chamber 4. The heater 6 serves to heat the solution 1 in the crucible 2.

At an upper end portion of the growth chamber 4 which is situated below the gate valve 5, there are provided a gas introduction pipe 7 for introducing a gas into the growth chamber 4 in order to form a gas atmosphere in the growth chamber 4 and a gas exhaust pipe 8 for exhausting the inside gas in the growth chamber 4. As the gas which is introduced into the growth chamber 4 through the gas introduction pie 7, appropriate gas such as hydrogen gas or argon gas can be used.

In this embodiment, a capping member 3 is kept afloat on the surface of the solution 1 accommodated in the crucible 2 such that the surface of the solution is covered by the capping member 3. The capping member 3 is designed such that it is kept afloat on the surface of the solution 1 in this way when a base substrate on which an epitaxial film is to be formed is not immersed in the solution 1, and it is subsided in the solution 1 when said substrate is immersed in the solution 1.

The capping member 3 is formed of a material whose relative density is lighter than that of the solution 1 and which can withstand a high temperature of 800 to 1100° C. in the liquid-phase epitaxy process. Such material can include quartz ($SiO_2$), carbon, boron nitride (BN), silicon nitride (SiN), and silicon.

The capping member 3 is designed to have a size which is somewhat smaller than the inner diameter of the crucible and which enables the capping member to desirably subside in the solution 1 and rise to the surface. Specifically, for example, the capping member 3 is designed to have a surface area corresponding to 90 to 98% of the surface area of the liquid surface of the solution 1.

Separately, as shown in FIG. 4, in order to prevent the capping member 3 from being caught by the inner wall of the crucible in the course of subsideing in the solution 1 or rising to the surface, it is possible to adopt a manner such that a plurality of guide members 21 are provided at the inner wall of the crucible 2 along the depth direction thereof, a nick 22 shaped in a form corresponding to a cross section form of said guide member 21 is formed at a prescribed position of the peripheral edge portion of the capping member 3, and in FIG. 4, the capping member 3 is descended or ascended along the guide members 21 while the nick 22 of the capping member 3 being engaged in mesh with one of the guide members 21.

Actually in this embodiment, four guide members 21 having a cross section in a triangle form are provided at the inner wall of the crucible 2 at an equal interval in the circumferential direction, and four nicks 22 shaped in a V-form are formed at prescribed four positions of the peripheral edge portion of the capping member 3 such that said four nicks 22 are corresponding to the four guide members 21 provided at the inner wall of the crucible 2. In this case, the capping member 3 is descended or ascended along the four guide members 21 while each of the four nicks 22 of the capping member 3 being engaged in mesh with the corresponding one of the four guide members 21.

Further, in order to mitigate the resistance when the capping member 3 is subsided in the solution 1, the capping member is provided with a pressure-removing means for relieving a pressure subjected thereunder when the capping member 3 is descended into the solution 1. The pressure-removing means may comprise minute holes formed at the capping member 3 or a pressure valve capable of being opened or closed with a prescribed pressure which is provided at the capping member.

Alternatively, in order to mitigate the resistance when the capping member 3 is subsided in the solution 1, it is possible to adopt a manner such that the capping member 3 is designed to have a propeller form or have a plurality of grooves obliquely formed at the peripheral portion thereof so that the capping member 3 is rotated by virtue of the resistance of the solution 1 when the capping member 3 is descended into the solution, whereby a pressure subjected to the back face of the capping member when it is subsided in the solution is relieved.

Now, in the case where a magnetic garnet crystal film which is used in a magnetic optical element is form by way of liquid-phase epitaxial growth, as the solution 1, there is used a solution obtained by dissolving reactant species comprising a garnet raw material in a solvent comprising PbO and $B_2O_3$.

In the case where a lithium niobate crystal film which is used in a non-linear optical element is formed by way of liquid-phase epitaxial growth, as the solution 1, for instance, a solution obtained by fusing $Li_2O$, $Nb_2O_5$, and $V_2O_5$ is used.

In the case where a GaAs crystal film as a III-V group compound semiconductor which is used in an oscillation element or a light emitting element is formed by way of liquid-phase epitaxial growth, as the solution 1, for instance, a solution obtained by dissolving a GaAs polycrystal and a dopant such as Si in a solvent comprising Ga is used.

In the case where a silicon crystal film which is used in a semiconductor integrated circuit or a solar cell element is formed by way of liquid-phase epitaxial growth, as the solution 1, for instance, a solution obtained by dissolving Si and a dopant such as Ga, B, Al, P or As in a solvent comprising Sn, In, Al, or Cu is used.

Description will be made with reference to FIG. 2. The liquid-phase growth apparatus shown in FIG. 2 is in operation where a base substrate is immersed in a solution for liquid-phase epitaxy to grow an epitaxial film on said substrate. Reference numerals 1 to 8 in FIG. 2 are of the same meanings as those of reference numerals 1 to 8 shown in FIG. 1. Besides, in FIG. 2, reference numeral 10 indicates a substrate holder, reference numeral. 11 a base substrate, reference numeral 12 a load lock chamber, reference numeral 13 a bellows, and reference numeral 14 a gate valve.

In the embodiment shown in FIG. 2, a plurality of base substrates 11 is retained in the substrate holder 10 in a state such that they are arranged in the substrate holder 10 while being slightly slanted. This is not a limiting arrangement. The substrates 11 may be arranged so that they are perpendicular to the circumferential wall of the substrate holder 10.

At least a portion of the substrate holder 10, which is immersed in the solution 1, is constituted by a heat-resistant materials, such as quartz or platinum (Pt), which is not influenced by liquid-phase epitaxy.

The substrate holder 10 is held by a shaft 10' so as to suspend downward. The shaft 10' which is fixed to the substrate holder 10 is extended to expose outside the load lock chamber 14 while passing through the gate valve 5 of the growth chamber 4, the gate valve 14 of the load lock chamber 14 and the load lock chamber 14. The exposed portion of the shaft 10' is enclosed by the bellows 13 which can expand and contract, so that the shaft 10' can move upward or downward to rise or lower the substrate holder 10 while maintaining airtightness of the load lock chamber 12.

The shaft 10' is connected to a driving mechanism including an elevating mechanism and a rotation mechanism (not shown in the figure). The elevating mechanism functions to move the shaft 10' upward or downward so as to rise or lower the substrate holder 10. The rotation mechanism functions to rotate the shaft 10' so as to rotate the substrate holder 10.

The load lock chamber 12 is structured such that it can move from side to side while being maintained in an airtight state by means of the gate valve 14.

The liquid-phase growth apparatus is operated, for instance, in the following manner.

The substrate holder 10 is positioned in the load lock chamber 12 by moving the shaft 10' by means of the driving mechanism, where a plurality of base substrates 11 are arranged and retained in the substrate holder 10. And the inside gas atmosphere of the load lock chamber 12 is substituted by a gas atmosphere composed of inert gas which is the same as that in the growth chamber 4.

After this, the gate valve 14 of the load lock chamber 12 and the gate valve 5 of the growth chamber 4 are opened, and the shaft 10' is moved by means of the driving mechanism to lower the substrate holder 10 so that the substrates 11 retained in the substrate holder 10 are immersed in the solution 1 accommodated in the crucible 2 arranged in the growth chamber 4. At this time, the capping member 3 is pushed down into the solution 1 together with the substrate holder 10 while being held at the bottom portion of the substrate holder 10.

During the liquid-phase epitaxy in the liquid-phase growth apparatus, it is possible that the substrate holder 10 having the substrates 11 retained therein is rotated or moved upward and downward by actuating the shaft 10' by means of the driving mechanism.

Separately, it is possible that a meshing portion comprising, for instance, a concaved portion is formed at the underside of the substrate holder 10 and a protrusion is formed at the front side of the capping member 3 so that said protrusion of the capping member 3 can be engaged with said meshing portion of the substrate holder 10. This enables to rotate the capping member 3 together with the substrate holder 10 when it is rotated whereby agitating the solution 1.

Specifically, for instance, as shown in FIG. 3, a protrusion 20 in a cross form such as a pulsator of a washing machine is formed at the front face of the capping member 3 which is faced to the underside of the substrate holder 10, and a meshing portion which corresponds to the protrusion 20 is formed at the underside of the substrate holder 10. The protrusion 20 functions to engage the capping member 3 with the underside of the substrate holder 10 and it also functions to rotate the capping member 3 together with the substrate holder 10 when it is rotated.

After the liquid-phase epitaxial growth on each of the substrates 11 in the crucible 2 is completed, the substrate holder 10 is lifted, where together with the lifting of the substrate holder 10, the capping member 3 automatically floats up by virtue of the buoyancy and it finally becomes to be again kept afloat on the liquid surface of the solution 1 as shown in FIG. 1.

In the following, the present invention will be described in more detail by illustrating an example. It should be understood that this example is only for the illustrative purpose and the scope of the present invention is not restricted by the example.

EXAMPLE

This example describes a preferred embodiment of the liquid-phase growth process in the case of forming a silicon single crystal film using the liquid-phase growth apparatus shown in FIG. 2.

The inside of the growth chamber 4 is maintained with a hydrogen gas atmosphere.

A mixture comprising 11 kg of indium (In) and 1 Kg of gallium (Ga) is accommodated in the crucible 2 which is made of quartz and has an inner diameter of 180 mm. Then, 35 g of silicon (Si) is dissolved in the mixture accommodated in the crucible 2 at a temperature of 930° C. to obtain a saturated solution, followed by elevating the temperature of the saturated solution to a temperature of 923° C. to obtain a supersaturated solution as the solution 1.

On the liquid surface of the solution 1, a member made of quartz which has a diameter of 178 mm and a thickness of 5 mm as the capping member 3 is kept afloat.

In the substrate holder 10 positioned in the load lock chamber 12, a plurality of $p^+$ silicon substrates having a diameter of 5 inches and having a porous layer with a thickness of 2 $\mu$m formed by way of anodic oxidation as the base substrates 11 are arranged and retained.

The load lock chamber 12 is connected to a hydrogen-annealing chamber (not shown in the figure) and the inside of the load lock chamber 12 is annealed with hydrogen gas at a temperature of 1050° C. for 20 minutes. After this, while maintaining the inside hydrogen gas atmosphere of the load lock chamber 12, the load lock chamber 12 is made to position right above the growth chamber 4 so as to communicate with the growth chamber 4 through the gate valve 14 and the gate valve 5.

Then, the gate valve 14 of the load lock chamber 12 and the gate valve 5 of the growth chamber 4 are opened, and the substrate holder 10 is lowered to immerse the substrates 11 retained in the substrate holder 10 in the solution 1. At this time, the capping member 3 is engaged with the underside of the substrate holder 10 and the capping member 3 is pushed down into the solution 1.

During the time when the substrates 11 retained in the substrate holder 10 are kept being immersed in the solution 1, the substrate holder 10 is rotated at a rotation speed of 10 rpm and together with this, the capping member 3 is also rotated, whereby the solution 1 is agitated.

While maintaining this state, when the solution 1 is gradually cooled at a temperature descending speed of 2° C. per a minute, a silicon single crystal film having a thickness of 80 $\mu$m is formed on each of the substrates 11 for 60 minutes.

As will be understood from the above description, in the present invention, when the base substrate is not immersed in the solution for liquid—phase epitaxy, because the capping member is kept afloat on the surface of the solution so as to cover the liquid surface, it is possible to prevent the solution from being vaporized and it is also possible prevent occurrence of a problem in that the solution is vaporized to deposit the liquid components thereof on the inner wall face of the growth chamber which become sources to absorb impurities. In addition, when the base substrate is introduced into the growth chamber, vapor of the solution is not deposited on the base substrate. Therefore, the causes which bring about defects in the crystal growth can be eliminated. This enables to obtain high quality epitaxial films at a reasonable cost.

Besides, by engaging the capping member with the underside of the substrate holder, the capping member is made such that it automatically descend and ascend and it also automatically rotate in accordance with the movement of the substrate holder. This makes it unnecessary to use a particular mechanism in order to actuate the capping member. This also makes it possible to efficiently agitate the solution when the capping member is subsided in the solution.

Further, by making to assist the capping member to ascend or descend by means of the guide member provided at the inner wall of the crucible, it is possible to prevent the capping member from being caught by the inner wall of the crucible on the way of the capping member to lower in the solution or on the way of the capping member to rise to the surface of the solution.

And making the capping member to have the pressure-removing means which functions to relieve the pressure subjected thereunder when the capping member is subsided in the solution, it is possible to mitigate the resistance which is brought about to the capping member when it is subsided in the solution.

What is claimed is:

1. A liquid-phase growth process comprising immersing a base substrate in a solution containing a reactant species to be grown dissolved therein which is accommodated in a crucible and growing a crystal film on said substrate, wherein a capping member is kept afloat on the surface of said solution before said substrate is immersed in said solution and said capping member is subsided in said solution upon immersing said substrate in said solution.

2. The liquid-phase growth process according to claim 1, wherein said substrate is retained in a substrate holder and said capping member is subsided in said solution accommodated in said crucible by intermeshing said capping member to said substrate holder having said substrate retained therein.

3. The liquid-phase growth process according to claim 2, wherein said substrate holder having said substrate retained therein is rotated and together with this rotation of said substrate holder, said capping member intermeshed to said substrate holder is rotated.

4. The liquid-phase growth process according to claim 1, wherein a guide member is provided at an inner wall of said crucible having said solution accommodated therein and said capping member is descended and ascended along said guide member.

5. The liquid-phase growth process according to claim 1, wherein a pressure subjected under said capping member when said capping member is subsided in said solution is relieved by a pressure-removing means.

6. The liquid-phase growth process according to claim 1, wherein when said capping member is subsided in said solution, said capping member is rotated to agitate said solution.

7. A liquid-phase growth apparatus having a crucible for accommodating a solution containing reactant species dissolved therein and a substrate holder for retaining a base substrate therein and which serves to immerse said substrate in said solution accommodated in said crucible, wherein said substrate is immersed in said solution and a crystal film is grown on said substrate, characterized in that said liquid-phase growth apparatus has a capping member which is kept afloat on the surface of said solution accommodated in said crucible when said substrate is not immersed in said solution and said capping member is subsided in said solution when said substrate is immersed in said solution.

8. The liquid-phase growth apparatus according to claim 7, wherein said substrate holder is provided with a meshing portion at the underside thereof and said capping member is provided with a protrusion at the front face side thereof which faces to said underside of said substrate holder, wherein said meshing portion of said substrate holder is engaged with said protrusion of said capping member.

9. The liquid-phase growth apparatus according to claim 8, wherein said substrate holder having said substrate retained therein is made to be rotatable so that when said substrate holder is rotated, along with this rotation of said substrate holder, said capping member intermeshed to said substrate holder is rotated.

10. The liquid-phase growth apparatus according to claim 7, wherein a guide member which assists said capping member to descend or ascend is provided at an inner wall of said crucible having said solution accommodated therein.

11. The liquid-phase growth apparatus according to claim 7, wherein said capping member is provided with a pressure-removing member which functions to relieve a pressure subjected under said capping member when said capping member is subsided in said solution accommodated in said crucible.

12. The liquid-phase growth apparatus according to claim 7, wherein when said capping member is provided with a means for rotating said capping member when said capping member is subsided in said solution accommodated in said crucible.

* * * * *